United States Patent
Kim et al.

(10) Patent No.: US 10,510,517 B2
(45) Date of Patent: Dec. 17, 2019

(54) CLEANING APPARATUS FOR AN EXHAUST PATH OF A PROCESS REACTION CHAMBER

(71) Applicant: RETRO-SEMI TECHNOLOGIES, LLC, Ipswich, MA (US)

(72) Inventors: Dong-Soo Kim, Gyeonggi-do (KR); Min-Su Joo, Gyeonggi-do (KR); Min Kyu Chu, GyoungGi-do (KR)

(73) Assignee: RETRO-SEMI TECHNOLOGIES, LLC, Ipswich, MA (US)

( * ) Notice: Subject to any disclaimer, the term of this patent is extended or adjusted under 35 U.S.C. 154(b) by 0 days.

(21) Appl. No.: 16/082,023

(22) PCT Filed: Jan. 26, 2017

(86) PCT No.: PCT/US2017/015075
§ 371 (c)(1),
(2) Date: Sep. 4, 2018

(87) PCT Pub. No.: WO2017/136216
PCT Pub. Date: Aug. 10, 2017

(65) Prior Publication Data
US 2019/0180990 A1 Jun. 13, 2019

Related U.S. Application Data

(60) Provisional application No. 62/289,600, filed on Feb. 1, 2016.

(51) Int. Cl.
*H01J 37/32* (2006.01)
*B08B 7/00* (2006.01)
*B08B 9/027* (2006.01)

(52) U.S. Cl.
CPC ...... *H01J 37/32834* (2013.01); *B08B 7/0035* (2013.01); *B08B 9/027* (2013.01);
(Continued)

(58) Field of Classification Search
CPC ............. H01J 37/32834; H01J 37/3211; H01J 37/32183; H01J 37/32862; B08B 9/027;
(Continued)

(56) References Cited

U.S. PATENT DOCUMENTS 6,045,618 A    4/2000   Raoux et al.
6,689,930 B1   2/2004   Pang et al.
(Continued)

OTHER PUBLICATIONS

Apr. 20, 2017, International Search Report and Written Opinion for International Patent Application No. PCT/US2017/015075, 6 pages.

*Primary Examiner* — Rudy Zervigon
(74) *Attorney, Agent, or Firm* — Lathrop Gage LLP

(57) ABSTRACT

A cleaning apparatus of an exhaust path of a process reaction chamber used in a manufacturing of articles including a semiconductor or an LCD. The cleaning apparatus of the exhaust path includes a housing having an inflow pipe, connected to an upstream end of the exhaust path, an outflow pipe, connected to a downstream end of the exhaust path, and a connecting pipe disposed between the inflow pipe and the outflow pipe. A radio frequency generator in the housing applies radio frequency power to the inflow pipe and to the outflow pipe via respective coils. Plasma induced within the inflow and outflow pipes from RF power applied via the respective coils causes the generation of radicals from the exhaust gas flowing within. The radicals act to dislodge accumulated particulates within the exhaust path downstream of the cleaning apparatus.

11 Claims, 9 Drawing Sheets

(52) U.S. Cl.
CPC ......... *H01J 37/321* (2013.01); *H01J 37/3211* (2013.01); *H01J 37/32183* (2013.01); *H01J 37/32862* (2013.01); *H01J 2237/335* (2013.01)

(58) Field of Classification Search
CPC .......... B08B 7/0035; B01D 2258/0283; B01D 2258/0216
USPC ...... 118/723 AN, 723 I, 723 IR; 156/345.48, 156/345.49
See application file for complete search history.

(56) References Cited

U.S. PATENT DOCUMENTS

| | | | |
|---|---|---|---|
| 2002/0135761 A1* | 9/2002 | Powell | G01J 3/02 356/316 |
| 2003/0205251 A1 | 11/2003 | Raaijmakers et al. | |
| 2006/0220574 A1* | 10/2006 | Ogawa | H01J 37/32082 315/111.21 |
| 2011/0133650 A1* | 6/2011 | Kim | H01J 37/32091 315/111.21 |

* cited by examiner

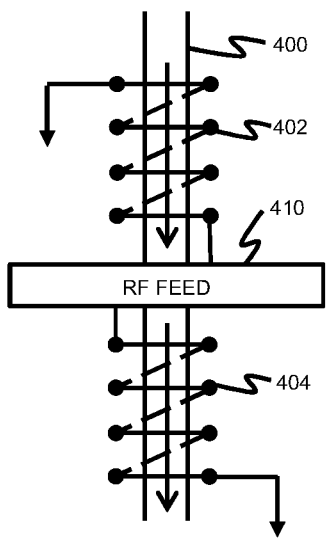
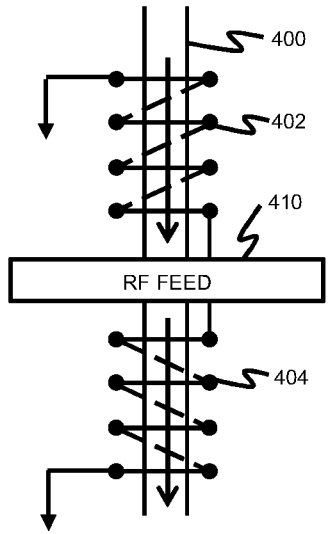
Fig. 6A        Fig. 6B
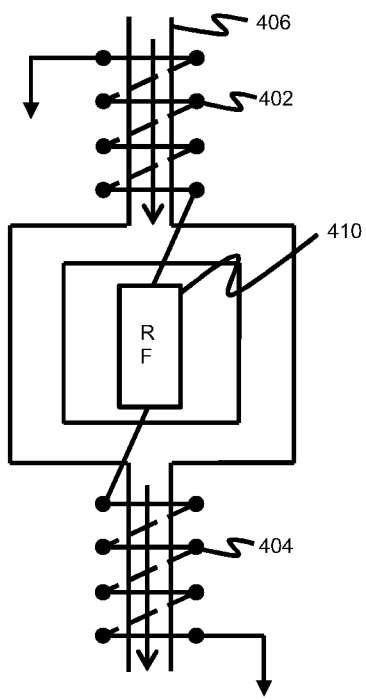
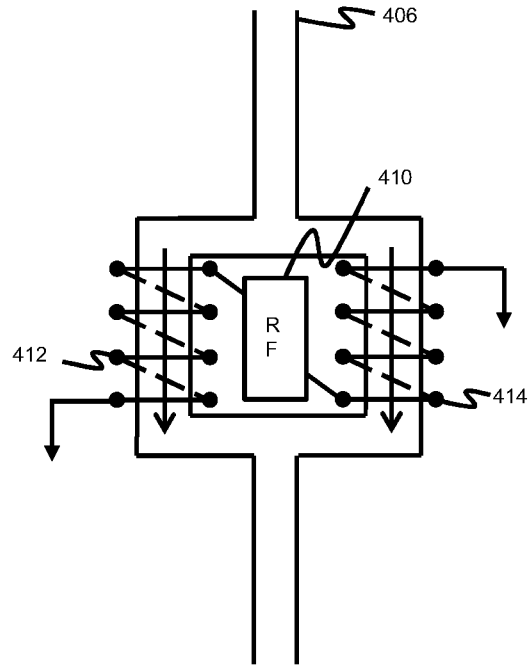
Fig. 7A        Fig. 7B

CLEANING APPARATUS FOR AN EXHAUST PATH OF A PROCESS REACTION CHAMBER

RELATED APPLICATIONS

This application is a 35 U.S.C. § 371 filing of International Patent Application No. PCT/US2017/015075, filed Jan. 26, 2017, which claims priority to U.S. Provisional Patent Application Ser. No. 62/289,600, filed Feb. 1, 2016. Each of the aforementioned applications is incorporated herein by reference in its entirety.

STATEMENT REGARDING FEDERALLY SPONSORED RESEARCH OR DEVELOPMENT

N/A

BACKGROUND OF THE INVENTION

The present invention relates to a cleaning apparatus for an exhaust path of a process reaction chamber used in a manufacturing process for semiconductors or LCDs, and more particularly, to a cleaning apparatus for the exhaust path in which an inflow pipe and an outflow pipe are formed inside a housing to which a gas inlet and a gas outlet are attached, radio frequency power from a radio frequency generator is applied to the inflow pipe and the outflow pipe, and a capacitor and a coil for impedance matching are provided.

In general, a plasma generator is used in a process of depositing or patterning a structure implemented on a semiconductor or a liquid crystal display LCD. Plasma refers to an ionized gas state consisting of ions, electrons, or radicals, and is generated by a high-temperature state, a strong electric field, or a radio frequency (RF) electromagnetic field.

In particular, the plasma generation by a glow discharge phenomenon is performed by free electrons excited by a direct current (DC) or radio frequency electromagnetic field, and the excited free electrons collide with gas molecules to generate activity groups such as ions, radicals, and electrons. Such activity groups physically or chemically act on the surface of target surfaces to alter the properties thereof.

In this way, a process of intentionally altering the surface properties of a material by an active group is referred to as a surface treatment, and generally, the surface treatment with plasma refers to cleaning or etching the surface of the material by utilizing the products of a plasma state. In the process reaction chamber for executing the surface treatment of the object using the plasma, an exhaust pipe is connected to the process reaction chamber in which a plasma is generated and from which a gas such as argon gas is discharged to the outside. A vacuum pump connected to or in-line with the exhaust pipe causes the exhaust gas to flow to the outside, while gate valves and a pressure regulating valve implement flow and pressure control of the exhaust gas. A scrubber reduces the concentration of harmful substances in the exhaust gas to a level below an acceptable standard prior to discharge of the exhaust gas to the atmosphere.

However, solid precipitate generated by the deposition or etching process taking place within the process reaction chamber may enter the exhaust pipe and accumulate on an interior surface of the exhaust pipe. Over time, this accumulation can cause operational failure of the gate valve or the pressure regulating valve or can lead to interference with the smooth emission of the exhaust gas by blocking the exhaust pipe.

Therefore, an operator needs to manually remove the solid precipitate of the exhaust gas to enable the continuous emission of the exhaust gas. However, since it is necessary to temporarily stop the reaction chamber processing during such manual cleaning, a decrease in productivity results. In addition, since harsh chemicals are used in the manual precipitation removal process, safety risks are also always present.

BRIEF SUMMARY OF THE INVENTION

The present invention solves the conventional problems described above by providing a cleaning apparatus for the exhaust path of a process reaction chamber which can inhibit the accumulation of particulates in the exhaust path, thereby obviating reduced productivity of an associated process reaction chamber. Worker safety is improved because the exhaust path of the process reaction chamber is cleaned through the use of the presently disclosed cleaning apparatus and not through manpower. Excellent cleaning effect is achieved.

According to an aspect of the present invention, there is provided a cleaning apparatus for the exhaust path of a process reaction chamber. The cleaning apparatus includes an inflow pipe and an outflow pipe formed on the inside of a cleaning apparatus housing to which a gas inlet and a gas outlet are attached. A radio frequency (RF) generator, also disposed within the housing, provides RF energy to the inflow pipe and the outflow pipe. Capacitors and coils for impedance matching are provided in conjunction with the inflow pipe and outflow pipe.

It should be understood that different embodiments of the invention, including those described under different aspects of the invention, are meant to be generally applicable to all aspects of the invention. Portions of any one embodiment may be combined with portions of any other embodiment. All examples provided herein are intended to be illustrative and non-limiting.

The cleaning apparatus of a process reaction chamber exhaust path of the present invention having a configuration as described has an effect that can obviate a reduction in productivity and can contribute to worker safety by cleaning the exhaust path of the process reaction chamber without the need for manual intervention.

Further, according to presently disclosed invention, fluorine radicals or chlorine radicals are formed twice in the cleaning apparatus, once in the inflow pipe and once in the outflow pipe, thereby exhibiting excellent cleaning effect.

Since the radio frequency power applied to the cleaning apparatus of the present invention is a radio frequency in the range of 40 to 100 MHz, the cleaning effect can be enhanced.

BRIEF DESCRIPTION OF THE SEVERAL VIEWS OF THE DRAWINGS

Various aspects of at least one embodiment of the present invention are discussed below with reference to the accompanying figures. It will be appreciated that, for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. For purposes of clarity, however, not every component may be labeled in every drawing. The figures are provided for the purposes of illustration and explanation and are not intended as a definition of the limits of the invention. In the figures:

FIGS. 6A and 6B are schematic diagrams of first and second embodiments of RF coils disposed about a gas pipe and an RF feed connected thereto;

FIGS. 7A, 7B, and 7C are schematic diagrams of third, fourth, and fifth embodiments of RF coils disposed about a gas pipe and an RF feed connected thereto;

DETAILED DESCRIPTION OF THE INVENTION

Figure 1:
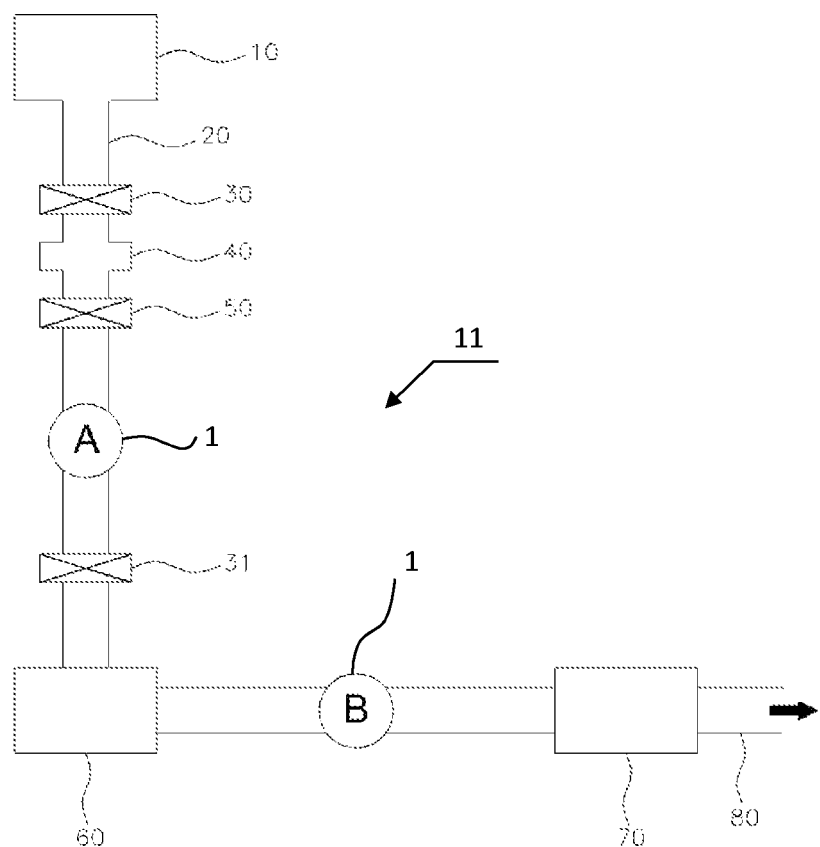
FIG. 1 is a schematic diagram of an exhaust path of a process reaction chamber in which a cleaning apparatus of the presently disclosed invention is installed.

In the following detailed description, numerous specific details are set forth in order to provide a thorough understanding of the various embodiments of the present invention. It will be understood by those of ordinary skill in the art that these embodiments of the present invention may be practiced without some of these specific details. In some instances, well-known methods, procedures, components and structures may not be described in detail so as not to obscure the embodiments of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a schematic diagram of an exhaust path 11 of a process reaction chamber 10 in which the cleaning apparatus 1 of the present invention is installed. As described above, the cleaning apparatus of the present invention is installed on an exhaust pipe 20 connected to the process reaction chamber.

A first gate valve 30 and a second gate valve 31 for controlling the flow and pressure of the exhaust gas with a pressure regulating valve 50 therebetween are installed in the exhaust pipe 20.

Also, a turbo-molecular pump 40 is installed between the first gate valve 30 and the pressure regulating valve 50. A vacuum pump 60 which provides the negative pressure for the discharge of exhaust gas from the process chamber 10 is installed on a downstream side of the second gate valve 31. The exhaust gas discharged by the vacuum pump 60 is discharged to the atmosphere through an exhaust port 80 after harmful substances are removed or reduced by a scrubber 70.

The cleaning apparatus 1 of the present invention, discussed in detail below and with respect to FIGS. 2-4, may be installed at a point (point A) between the pressure regulating valve 50 and the second gate valve 31 of the exhaust part system of the process reaction chamber. Alternatively, the cleaning apparatus 1 of the present invention may be installed at a point (point B) between the vacuum pump 60 and the scrubber 70. Furthermore, in order to maximize the exhaust path cleaning, instances of the cleaning apparatus 1 can be installed at both points A and B.

Hereinafter, the configuration and operation of the cleaning apparatus of the exhaust path of the presently disclosed invention, installed in a process reaction chamber exhaust path as described above, will be described in further detail with reference to FIGS. 2 to 4. FIG. 2 is a perspective view of the cleaning apparatus 1 of the present invention, FIG. 3 is a partially exploded perspective view of the cleaning apparatus of the present invention, and FIG. 4 is a side cutaway view of the cleaning apparatus of the present invention.

Figure 2:
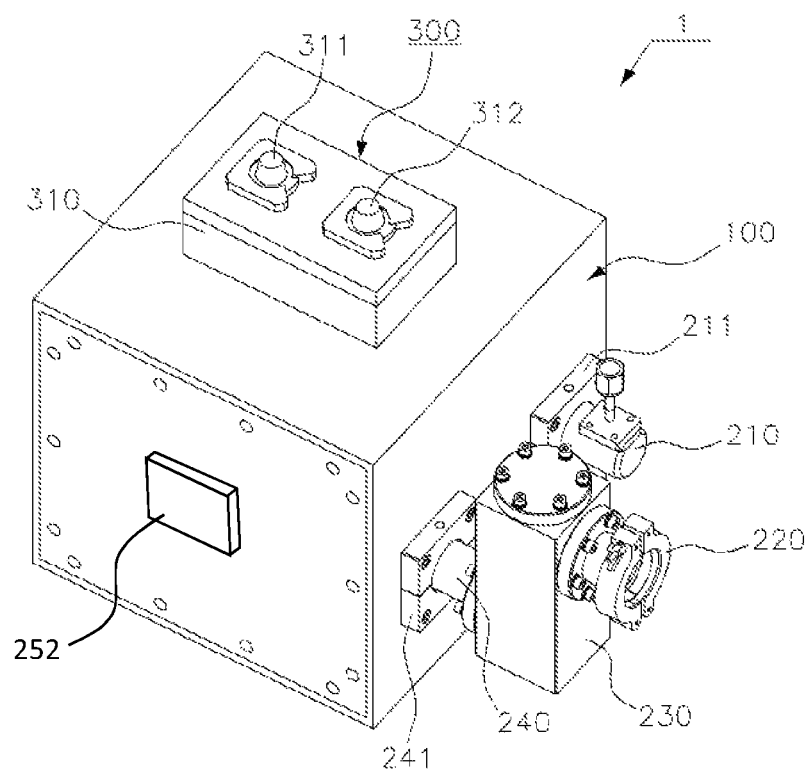
FIG. 2 is a perspective view of the cleaning apparatus of FIG. 1.
Figure 3:
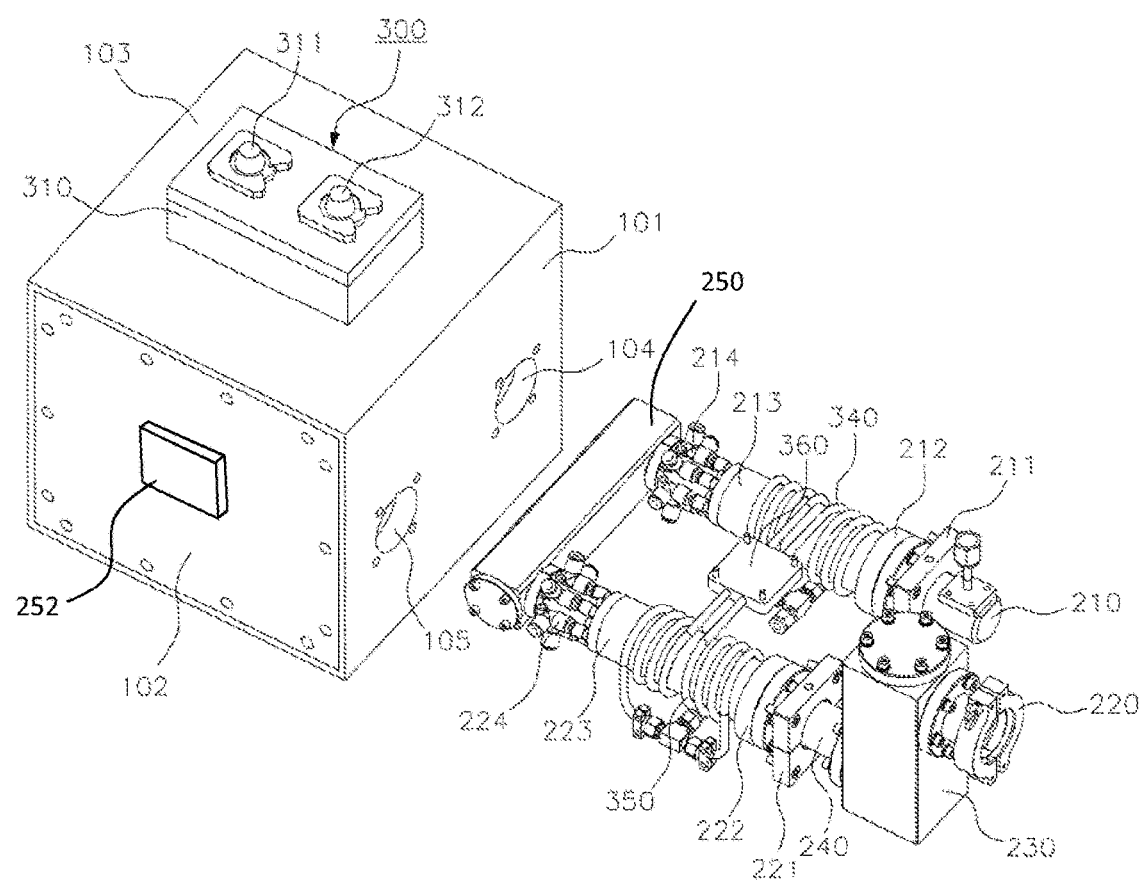
FIG. 3 is an exploded perspective view of the cleaning apparatus of FIG. 2.
Figure 4:
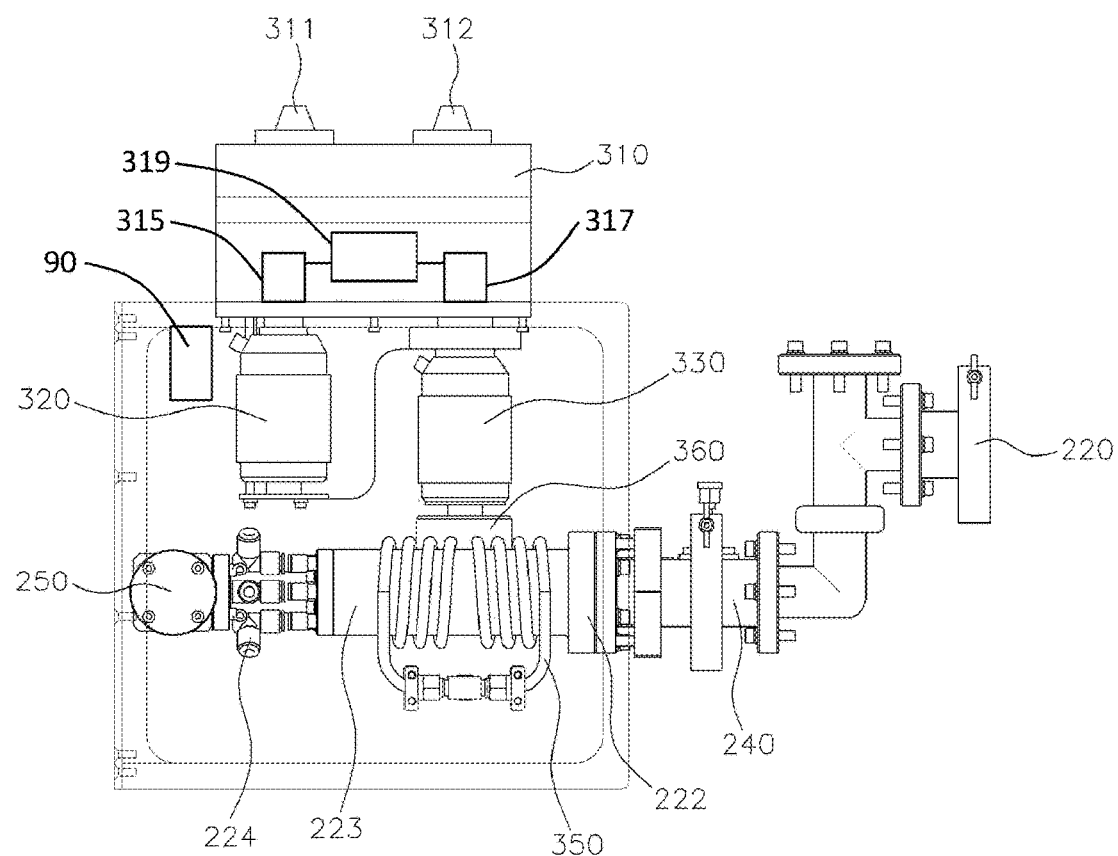
FIG. 4 is a side view of the cleaning apparatus of FIG. 2.

Referring to FIGS. 2-4, the cleaning apparatus 1 includes a hexahedral-shaped housing 100 which has a front plate 101, side plates 102, a top plate 103, and a gas inlet 210 and a gas outlet 220 attached to the front plate 101 of the housing 100. The gas inlet is in mechanical and fluid communication with an upstream portion of the exhaust pipe 20, while the gas outlet is in mechanical and fluid communication with a downstream portion of the exhaust pipe. The exhaust gas flow thus extends from the exhaust pipe, into the gas inlet, through the cleaning apparatus as described below, out the gas outlet and back into a downstream portion of the exhaust pipe.

An inlet mounting plate 211 and an inlet coupling 212, which attach the gas inlet 210 to the front plate 101, are mounted to the rear end of the gas inlet 210. This direction is also considered downstream of the inlet.

One, upstream side of an inflow pipe 213, through which gas introduced into the gas inlet 210 flows, is connected to the inlet coupling 212, while the other, downstream side of the inflow pipe is connected to a connecting block 214 attached to a connecting pipe 250.

The connecting pipe 250 is a pipeline which allows the gas introduced from the inflow pipe 213 to flow to an outflow pipe 223. As noted above, one end of the connecting pipe is connected to the inflow pipe 213 through an inflow connecting block 214. The other end of the connecting pipe is connected to the outflow pipe 223 through an outflow connecting block 224.

An outlet block 230 and an outlet connecting pipe 240 are attached to the rear end of the gas outlet 220. An outlet mounting plate 221 and an outlet coupling 222, attached to the outlet connecting pipe 240, are mounted to the front plate 101. One, downstream end of the outflow pipe 223 is coupled to an opposite side of the outlet coupling, thereby allowing the gas flowing through the connecting pipe 250 to flow to the gas outlet 220.

Disposed about each of the inflow pipe 213 and the outflow pipe 223 are electrical conductors configured as paired RF coils 340, 350. The first pair of coils 340 is wound around an outer circumferential surface of the inflow pipe 213 several times, and the second pair of coils 350 is wound around an outer circumferential surface of the outflow pipe 223 several times. In the illustrated embodiment of FIGS. 3 & 4, each coil of each pair has four turns.

Radio frequency (RF) power is applied to a first end of the first pair of coils 340 via a matching network 500 and a terminal on a plate-like connector 360. Radio frequency power is applied to a first end of the second coil 350 via the matching network and another terminal on the plate-like connection. The second end of the first and second coils are connected to ground.

A variety of coil configurations are contemplated. RF power may be divided among coils in two, four, or more paths in order to define plural current paths about a pipe or pipes, all with a common reference. The flux lines for each of the coils are aligned so as to enhance the magnetic fields within the respective pipes. With such configurations, low impedance for VHF frequency resonance is presented and the area for sustaining a plasma within the pipes is enlarged. Low impedance enhances the ability to achieve desired impedance matching while high current values enhance plasma generation.

In FIGS. 6A and 6B, RF power is applied to first and second coils 402, 404 via an RF feed 410. For example, the RF feed may be the plate-like connector 360 as shown in FIG. 3. As may be seen in these figures, a variety of physical configurations are possible, each with the effect of generating plasma-inducing magnetic fluxes as shown by the arrows in the respective pipes 400.

In FIGS. 7A and 7B, a split pipe 406 is provided. In FIG. 7A, the serial coil 402, 404 configuration of FIG. 6A is employed, with serial magnetic flux lines generated. In FIG. 7B, coils 412, 414 are disposed on either side of the split pipe 406, generating lines of flux that are parallel.

Figure 7C:
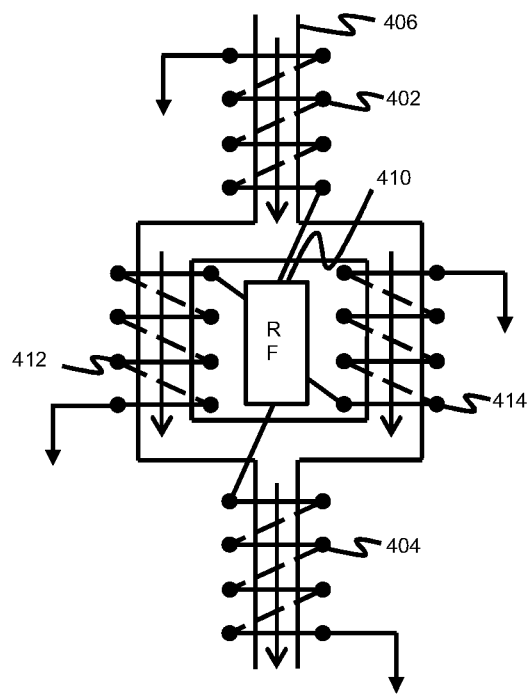

In FIG. 7C, the embodiments of FIGS. 7A and 7B are combined, resulting in four flux lines for greater plasma generation.

Figure 8:
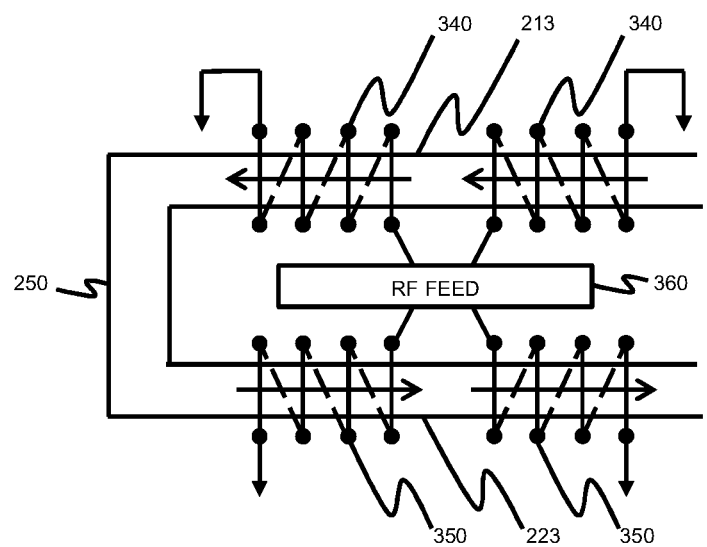
FIG. 8 is a schematic diagram of an inflow pipe having a pair of coils disposed thereabout, a connecting pipe, an outflow pipe having a pair of coils disposed thereabout, and an RF feed connected to the coils.

FIG. 8 is a simplified schematic of the coil embodiment employed in FIG. 3. The first coil pair 340 is disposed about the inflow pipe 213 and the second coil pair 350 is disposed about the outflow pipe 223. Both coil pairs are energized by RF power coupled through the plate-like connector 360 serving as the RF feed.

In all of these exemplary configurations, multiple coils are closely spaced, resulting in an amplification of the applied magnetic flux, deeper penetration into the gas flowing through the pipe, and higher density of resulting plasma.

Figure 9:
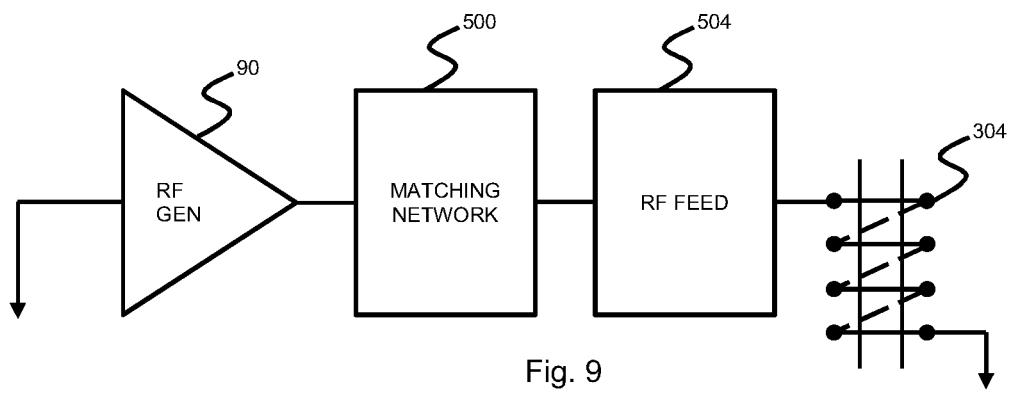
FIG. 9 is a schematic diagram of an RF generator, a matching network, and an RF feed connected to a coil disposed about a pipe.
Figure 10A:
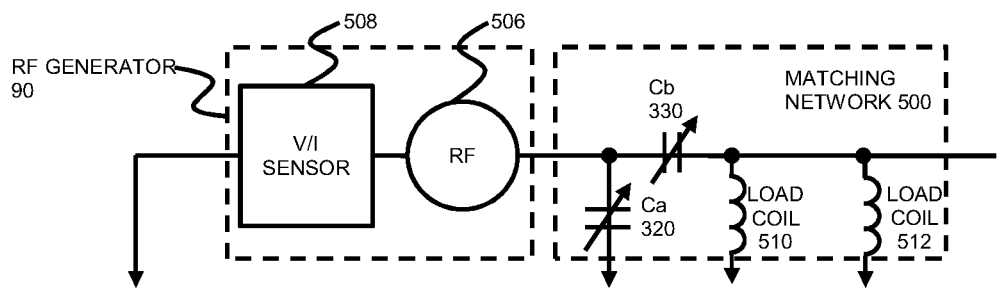
FIGS. 10A and 10B are exemplary embodiments of a matching network for use with the RF generator of FIG. 9.
Figure 10B:
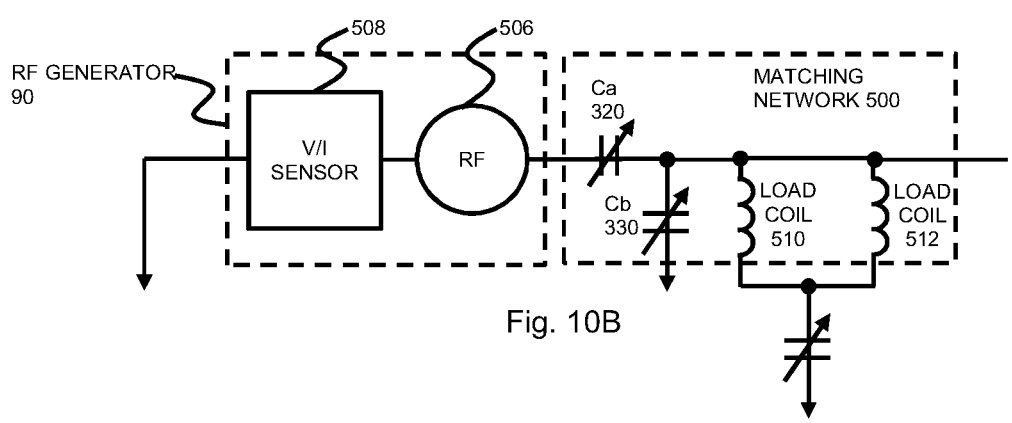

In the abstract and with reference to FIG. 9, each coil, such as one of the first pairs of coils 340, is driven by connection to an RF feed 504, such as the plate-like connector 360. The RF feed is driven by an RF generator, phase shift, and power divide circuit 90 via a matching network 500. Exemplary embodiments are shown in FIGS. 10A and 10B, where an RF generator, comprised of a voltage/current (V/I) sensor 508 and an RF power supply 506, drive load coils 510, 512 via a matching network comprised of the first and second capacitors 320, 330 and dual load coils. Other circuit configurations are contemplated.

Capacitors 320, 330 form the matching network 500 and are wired to the first coil 340 and the second coil 350 for impedance matching of the radio frequency power applied from a radio frequency generator 90. In the example of the present invention, the first capacitor 320 and the second capacitor 330 are connected to the first coil 340 and the second coil 350 through the connector 360 to form an LC network, thereby performing the impedance matching of the radio frequency power.

Figure 11A:
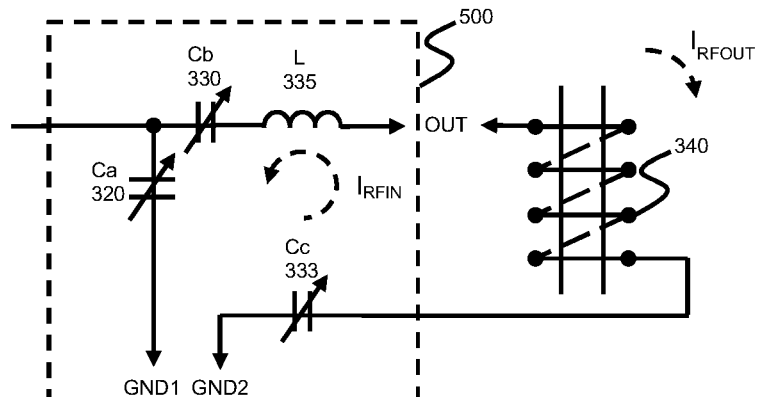
FIGS. 11A, 11B, and 11C are exemplary embodiments of matching network circuits for use with the RF generator of FIGS. 9, 10A, and 10B.
Figure 11B:
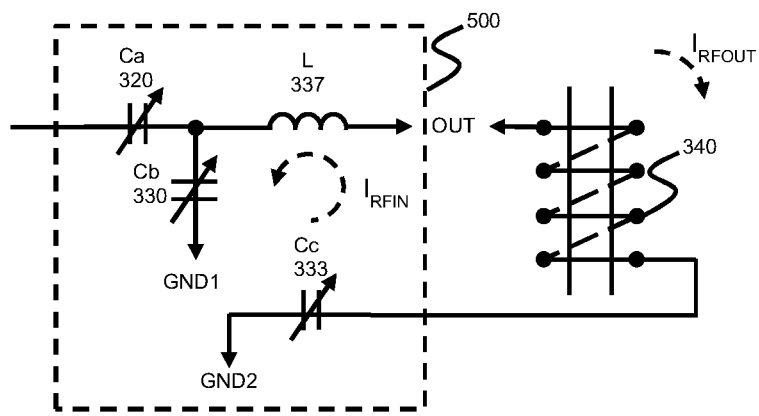
Figure 11C:
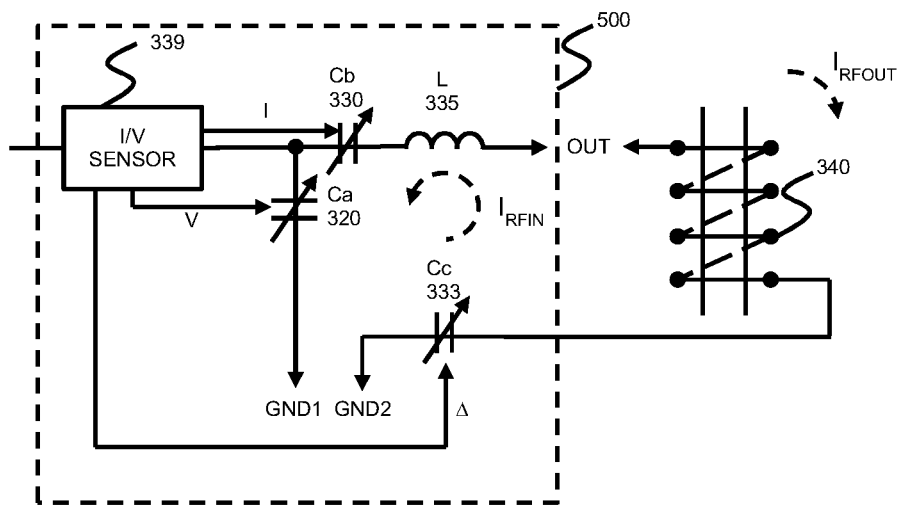

With reference to FIGS. 11A, 11B, and 11C, various configurations of the capacitors realizing the matching network 500 may be employed. The embodiments of FIGS. 10A and 10B are preferably augmented by a third variable capacitor $C_C$ 333, inductor L 335 or L 337, and second ground GND2, in addition to the primary ground GND1 directly grounded to the chassis. The additional variable capacitor $C_C$ enables a balanced flow of VHF currents in the matching network and the second ground GND2 acts as a ground for an internal current $I_{RFIN}$. The inductor L value is selected within the range of 0.15 μH to 0.425 μH, and more preferably within the range of 0.17 μH to 0.35 μH. Tuning for impedance matching is impossible if the value for the inductor L is out of these ranges, or absent altogether. Thus, these inductor value ranges are important aspects of the matching network 500.

The circuit of FIG. 11A is preferable for load coils in which the load impedance is low, whereas the circuit of FIG. 11B is preferable for load coils in which the load impedance is high.

A further embodiment of the matching network 500 is illustrated in FIG. 11C. Here, a current/voltage (I/V) sensor 339 is introduced into the circuit of FIG. 11A. The RF power is analyzed in the sensor. The magnitude of the received current (I) is used for adjusting the capacitance value of the first capacitor $C_A$ 320, while the magnitude of the detected voltage (V) is used to adjust the capacitance value of the second capacitor $C_B$ 330. A delta measurement (Δ), representing the ratio of current to voltage, is used to adjust the capacitance value of the third capacitor $C_C$ 333. Specifically, when the value of Δ>0, a high current state, the capacitance value of the third capacitor $C_C$ is adjusted downward. When the value of Δ<0, a low current state, the capacitance value of the third capacitor $C_C$ is adjusted upward. When Δ=0, the capacitance value of the third capacitor $C_C$ is not adjusted. Actual adjustment of the capacitors is achieved through the use of a control circuit and motors, as described subsequently.

Preferably, as shown in FIGS. 11A, 11B, and 11C, the first capacitor 320 and the second capacitor 330 are variable capacitors, as well as the third capacitor 333, if employed. With reference to FIG. 4, a first adjusting pin 311 and a second adjusting pin 312 for adjusting the capacitance of the first capacitor 320 and the second capacitor 330 are installed in a regulation box 310 attached to the top plate 103 of the housing 100. Other physical configurations are envisioned. Motors 315, 317, whose rotation is controlled by the adjusting pins, adjust the capacitance of the first capacitor 320 and the second capacitor 330, respectively, and are provided in the adjusting box 310 between the adjusting pins and the capacitors themselves. A control circuit 319 for controlling a rotation amount of the motors is mounted thereon. Since the control circuit is a known control circuit, further detailed description will not be provided. The control circuit may be under the control of, for instance, the I/V Sensor 339 shown in FIG. 11C for achieving automated control over the capacitor settings.

In FIG. 4, an RF generator, phase shifter, and power divider circuit 90 is illustrated within the housing 101, proximate a regulation box 310 containing tuning elements for the capacitors, as described above. The location of the circuit 90 may be selected as a matter of convenience. As shown in FIGS. 2 and 3, a display 252 such as an LCD or an LED screen which displays the capacitance of the first and second capacitors 320, 330 is provided in conjunction with the housing 100. An air variable capacitor (AVC) or a vacuum variable capacitor (VVC), both of which are conventional variable capacitor elements, may be used as the first capacitor 320 and the second capacitor 330. The capacitors 320, 330 are illustrated mounted to the top plate 103 of the housing 100.

The phase shifter of the RF generator, phase shift, and power divider circuit 90 is utilized to place the first capacitor 320 out of phase with the second capacitor 330, thereby generating a persistent plasma that extends from the inlet to the outlet. The power divider of this circuit 90 is functionally programmed to control the ratio of power applied to each of the first and second capacitors.

The impedance to the radio frequency power applied through the LC circuit network between the first coil 340 and the second coil 350, connected in parallel to each other, is impedance matched by adjusting the capacitance of the first capacitor 320 and the second capacitor 330. This is achieved through the use of the adjusting pins 311, 312 projecting from the regulation box 310, or by use of the control circuit described above. The adjusted capacitance values are then displayed on the display 252.

The operation of the cleaning apparatus of the process reaction chamber exhaust path of the presently disclosed invention is now described. Exhaust gas containing fluorine or chlorine flows from the exhaust pipe 20 into the gas inlet 210 of the cleaning apparatus 1 of the present invention. The fluorine or chlorine gas includes perfluorocarbon (PFC) gases such as $NF_3$, $C_3F_8$, $C_4F_8$ and $SF_6$, $Cl_2$, HCl, $BCl_3$ and $CCl_4$, $O_2$, and Ar.

The fluorine gas or chlorine gas flowing into the gas inlet 210 flows through the inflow pipe 213, the connecting pipe 250, and the outflow pipe before exiting the gas outlet 220 and returning to the exhaust pipe 20. During this transition, the fluorine gas or chlorine gas is converted into a fluorine radical gas or a chlorine radical gas by the radio frequency power from the radio frequency generator 90 applied to the coils about the inflow pipe 213 and the outflow pipe 223.

Figure 5:
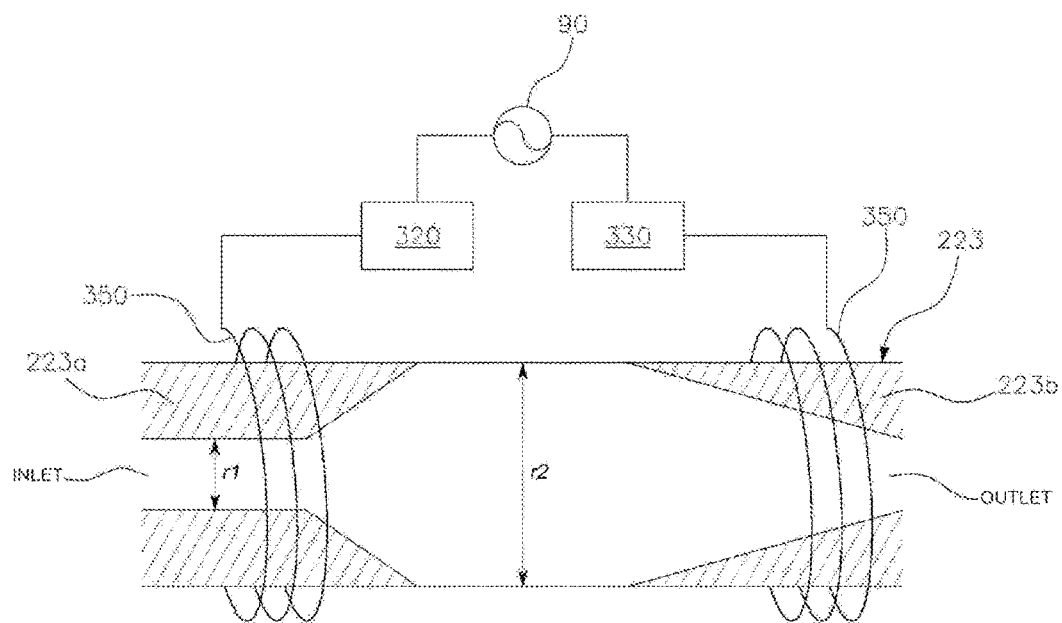
FIG. 5 is a schematic cross-sectional view of a flow pipe of the cleaning apparatus of FIG. 2.

In order to allow the fluorine gas or chlorine gas to flow through the inflow pipe 213 and outflow pipe 223 at a constant rate, as illustrated in FIG. 5, an inner diameter r1 of the inlet side inner wall 223a of the outflow pipe 223 is smaller than an inner diameter r2 of a central portion of the outflow pipe 223, and thereafter, an outlet side inner wall 223b of the outflow pipe 223 is formed in a shape which gradually slopes inward in the direction of the outlet, i.e., in an inwardly tapered shape. Thus, the inflow pipe and the outflow pipe are designed so that the gas speed increases in a small-diameter portion of the inlet side of the outflow pipe 223 then slightly decreases at the center of the outflow pipe 223, allowing the RF energy to effect the gas for a longer time period due to the slower speed. The gas containing fluorine or chlorine radicals can then be discharged from the pipeline of the outflow pipe 223 with increased speed on the outlet side. This configuration of the outflow pipe 223 may also be applied to the configuration of the inflow pipe 213.

The fluorine radical gas or the chlorine radical gas generated as described above etches and removes the solid precipitate generated from the process reaction chamber 10, while sequentially passing through the exhaust path elements downstream of the cleaning apparatus.

By cleaning the exhaust path of the process reaction chamber by application of RF power as described above rather than by manual intervention, it is possible to prevent a reduction in productivity and to provide enhanced worker safety.

Further, since the cleaning apparatus of the exhaust part of the present invention generates fluorine radicals or chlorine radicals twice, once through the inflow pipe 213 and once through the outflow pipe 223, the generated gas can exhibit an enhanced cleaning effect.

The radio frequency energy applied to the cleaning apparatus of the present invention is in the 40 to 100 MHz range. In one particular embodiment, a frequency of 60 MHz is used. Such a high frequency RF power results in VHF frequency resonance and the resulting high density plasma exhibits an excellent cleaning effect with low power consumption.

While the present invention has been described with respect to the specific embodiments, it will be apparent to those skilled in the art that various changes and modifications may be made without departing from the spirit and scope of the invention as defined in the following claims.

What is claimed:

1. A cleaning apparatus installed in an exhaust path of a process reaction chamber, the apparatus comprising:
    an inflow pipe having an associated gas inlet for receiving exhaust gas from an upstream portion of the exhaust path;
    an outflow pipe having an associated gas outlet for expelling exhaust gas from the cleaning apparatus into a downstream portion of the exhaust path;
    a connecting pipe fluidly connecting the inflow pipe to the outflow pipe;
    a first radio frequency (RF) coil assembly wound around an outer circumferential surface of the inflow pipe and a second RF coil assembly wound around an outer circumferential surface of the outflow pipe;
    an RF generator for generating RF power;
    a matching network for receiving the RF power from the RF generator and for applying it to one end of each of the first and second RF coil assemblies, a second end of each of the first and second RF coils being connected to ground;
    wherein flux lines for each of the first and second coil assemblies, when energized by RF power from the RF generator via the matching network, cause VHF resonance within the respective inflow or outflow pipe, thereby forming plasma within the exhaust gas flowing therethrough, the plasma forming free radicals from the exhaust gas for cleaning a portion of the exhaust path of the process reaction chamber downstream of the cleaning apparatus, and
    wherein one or both of the inflow pipe and the outflow pipe is configured so that a diameter (r1) of an inlet side inner wall is formed smaller than a diameter (r2) of a central portion of the inflow or outflow pipe, and an outlet side inner wall has a tapered shape that gradually slopes inward toward the outlet.

2. The cleaning apparatus of claim 1, wherein the first and second coil assemblies each comprise a pair of coils.

3. The cleaning apparatus of claim 2, wherein each coil of the pair of coils is wrapped around the respective inflow pipe or outflow pipe at least four full turns.

4. The cleaning apparatus of claim 1, wherein the RF generator is comprised of a voltage/current sensor and an RF power supply.

5. The cleaning apparatus of claim 1, wherein the matching network comprises two capacitors and two load coils forming an LC network for performing impedance matching for the RF power supply.

6. The cleaning apparatus of claim 5, wherein each of the two capacitors is a variable capacitor.

7. The cleaning apparatus of claim 6, wherein the two capacitors are an air variable capacitor or a vacuum variable capacitor.

8. The cleaning apparatus of claim 6, wherein the capacitance of each of the two capacitors is varied to maximize impedance matching between the RF power supply and the first and second coil assemblies.

9. The cleaning apparatus of claim 8, further comprising a control circuit and wherein the matching circuit further comprises a current/voltage sensor associated with the RF power received from the RF power supply, the control circuit for controlling the two variable capacitors in response to current and voltage measurements received from the current/voltage sensor.

10. The cleaning apparatus of claim 1, further comprising an RF feed for coupling the RF power to the first and second coil assemblies via the matching circuit.

11. The cleaning apparatus of claim 1, wherein the radio frequency power generated by the RF generator has a radio frequency of 40 to 100 MHz.

* * * * *